(12) United States Patent
Hung et al.

(10) Patent No.: US 9,018,640 B1
(45) Date of Patent: Apr. 28, 2015

(54) SILICON CARBIDE POWER DEVICE EQUIPPED WITH TERMINATION STRUCTURE

(71) Applicant: Hestia Power Inc., Hsinchu (TW)

(72) Inventors: Chien-Chung Hung, Hsinchu (TW);
Cheng-Tyng Yen, Hsinchu (TW);
Lurng-Shehng Lee, Hsinchu (TW);
Chwan-Ying Lee, Hsinchu (TW)

(73) Assignee: Hestia Power Inc., Hsinchu (TW)

( * ) Notice: Subject to any disclaimer, the term of this patent is extended or adjusted under 35 U.S.C. 154(b) by 0 days.

(21) Appl. No.: 14/196,629

(22) Filed: Mar. 4, 2014

(30) Foreign Application Priority Data

Oct. 16, 2013 (TW) .............................. 102137240 A

(51) Int. Cl.
*H01L 29/15* (2006.01)
*H01L 29/06* (2006.01)
*H01L 29/16* (2006.01)

(52) U.S. Cl.
CPC ........ *H01L 29/0619* (2013.01); *H01L 29/1608* (2013.01)

(58) Field of Classification Search
USPC .............................................. 257/77; 438/105
See application file for complete search history.

(56) References Cited

U.S. PATENT DOCUMENTS

| 2006/0043480 A1* | 3/2006 | Tsuchitani et al. ........... 257/341 |
| 2010/0032685 A1 | 2/2010 | Zhang et al. |
| 2012/0205666 A1* | 8/2012 | Henning et al. ................ 257/77 |

* cited by examiner

*Primary Examiner* — Douglas Menz
(74) *Attorney, Agent, or Firm* — Muncy, Geissler, Olds & Lowe, P.C.

(57) ABSTRACT

A silicon carbide power device equipped with termination structure comprises a silicon carbide substrate, a power element structure and a termination structure. The silicon carbide substrate contains a drift layer which has a first conductivity and includes an active zone and a termination zone. The power element structure is located in the active zone. The termination structure is located in the termination zone and has a second conductivity, and includes at least one first doped ring abutting and surrounding the power element structure and at least one second doped ring surrounding the first doped ring. The first doped ring has a first doping concentration smaller than that of the second doped ring and a first doping depth greater than that of the second doped ring, thereby can increase the breakdown voltage of the silicon carbide power device.

12 Claims, 6 Drawing Sheets

SILICON CARBIDE POWER DEVICE EQUIPPED WITH TERMINATION STRUCTURE

FIELD OF THE INVENTION

The present invention relates to a semiconductor element and particularly to a power device equipped with termination structure.

BACKGROUND OF THE INVENTION

Power devices are widely used to form various types of switch elements such as power supply switches, telecommunication switches, power switches and the like. They must have an active zone to allow a large amount of current to pass through, and also a termination zone to withstand a greater breakdown voltage.

Hence, in terms of design of the power device, aside from the active zone for current to pass through, a termination structure also has to be provided to avoid breakdown from taking place too soon during reverse bias operation, thereby to improve reliability of the element. The conventional termination structure generally can be divided into several types, such as local oxidation of silicon (LOCOS), field plate and guard ring. U.S. publication No. 2010/0032685 discloses a power device equipped with termination structure that includes a substrate. The substrate contains a drift layer with a first conduction type, a buffer layer with a second conduction type different from the first conduction type, and a termination structure with the second conduction type. The buffer layer is located on the drift layer and forms a P-N junction with the drift layer. The termination structure is located on the drift layer abutting the buffer layer. The buffer layer has a step portion extended to the termination structure to cover partially the termination structure, thereby to withstand the electric field generated by a high breakdown voltage.

The aforesaid technique has to form an extra buffer layer to enhance the capability of the power device to withstand the breakdown voltage. This not only requires additional processes for manufacturing the buffer layer during fabrication of the power device, also leaves room for improvement on the power device in terms of withstanding the breakdown voltage.

SUMMARY OF THE INVENTION

The primary object of the present invention is to solve the problems of the conventional power device that require an extra buffer layer to withstand the breakdown voltage and result in additional manufacturing processes of the power device, and still have deficiency on the power device in terms of the capability to withstand the breakdown voltage.

To achieve the foregoing object, the present invention provides a silicon carbide power device equipped with termination structure. It comprises a silicon carbide substrate, a power element structure and a termination structure. The silicon carbide substrate contains a drift layer which has a first conductivity and includes an active zone and a termination zone surrounding the active zone. The power element structure is located in the active zone. The termination structure is located in the termination zone and has a second conductivity different from the first conductivity, and includes at least one first doped ring abutting and surrounding the power element structure and at least one second doped ring surrounding the first doped ring.

The first doped ring has a first doping concentration smaller than that of the second doped ring, and a first doping depth greater than that of the second doped ring.

Through the first and second doped rings with the first doping concentration of the first doped ring smaller than that of the second doped ring and the first doping depth of the first doped ring greater than that of the second doped ring, the termination structure has greater capability to withstand the breakdown voltage without the need of adding an extra buffer layer, thus can improve reliability of the silicon carbide power device and also reduce manufacturing cost thereof.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENTS

Figure 1:
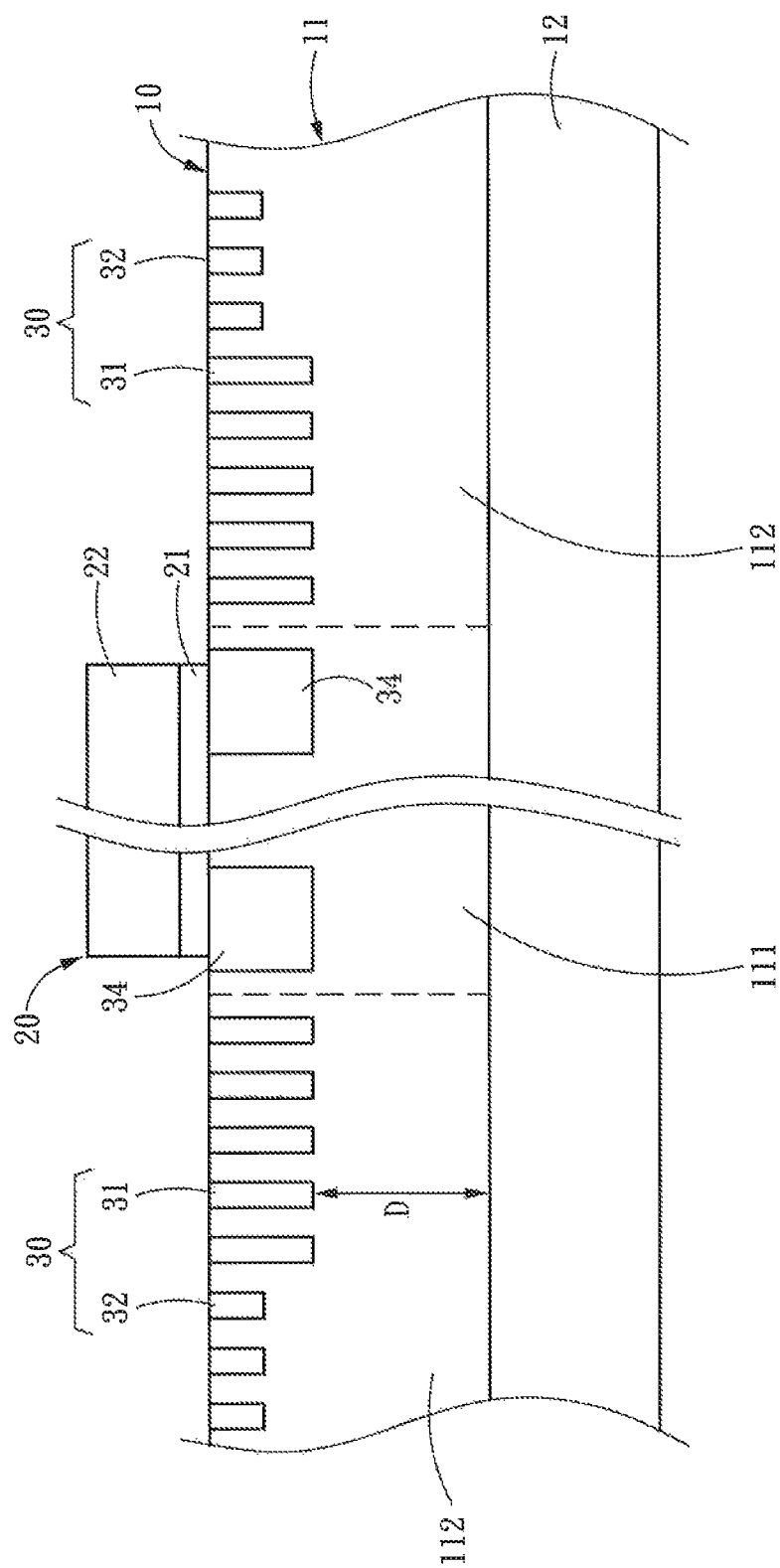
FIG. 1 is a schematic view of the structure of a first embodiment of the invention.

Please refer to FIG. 1 for a first embodiment of the invention. It is a silicon carbide power device equipped with termination structure that comprises a silicon carbide substrate 10, a power element structure 20 and a termination structure 30. The silicon carbide substrate 10 has a base layer 12 and a drift layer 11 located on the base layer 12. Both the base layer 12 and drift layer 11 have a first conductivity. In this embodiment the first conductivity can be N-type doping. The base layer 12 has an electronic concentration greater than that of the drift layer 11, but not limited to this. The drift layer 11 further has an active zone 111 and a termination zone 112 surrounding the active zone 111.

The power element structure 20 is located in the active zone 111 and can be a Schottky diode or metal-oxide semiconductor field effect transistor. In this embodiment, the power element structure 20 is the Schottky diode as an example for discussion herein. The Schottky diode includes a Schottky junction layer 21 to form Schottky contact with the silicon carbide substrate 10 and a metal conductive layer 22 located on the Schottky junction layer 21. The termination structure 30 is located in the termination zone 112 and has a second conductivity different from the first conductivity. The second conductivity can be P-typed doping. The termination structure 30 includes at least one first doped ring 31 and at least one second doped ring 32. The first doped ring 31 abuts and surrounds the power element structure 20. The second doped ring 32 surrounds the first doped ring 31 at an outer side. In this embodiment, there are five first doped rings 31 and seven second doped rings 32, but it is not the limitation. The number of the first doped ring 31 and second doped ring 32 can be adjusted by balancing between the area of the element and required capability of withstanding the breakdown electric field of the element. In addition, the silicon carbide power device further can include at least one doped well 34 which is located below the power element structure 20 and doped to have the second conductivity.

In the first embodiment, the first doped ring 31 has a first doping concentration smaller than that of the second doped ring 32 and a first doping depth greater than that of the second doped ring 32. In this embodiment the first doping concentration is ranged from 1E17 to 1E19 cm$^{-3}$, and the first doping depth is ranged from 0.5 to 1.5 um; while the second doping concentration of the second doped ring 32 is ranged from 1E18 to 5E19 cm$^{-3}$, and the second doping depth is ranged from 0.3 to 1 um. Hence the first doped ring 31 is closer to the power element structure 20 than the second doped ring 32, and spaced from the base layer 12 at a shorter distance D. Therefore, when the silicon carbide power device is subject to a reverse bias voltage, the first doped ring 31 can help to smooth distribution of a depletion curve generated in the drift layer 11 and reduce distribution of electric field to enhance the capability of the silicon carbide power device to withstand breakdown voltage.

Figure 2:
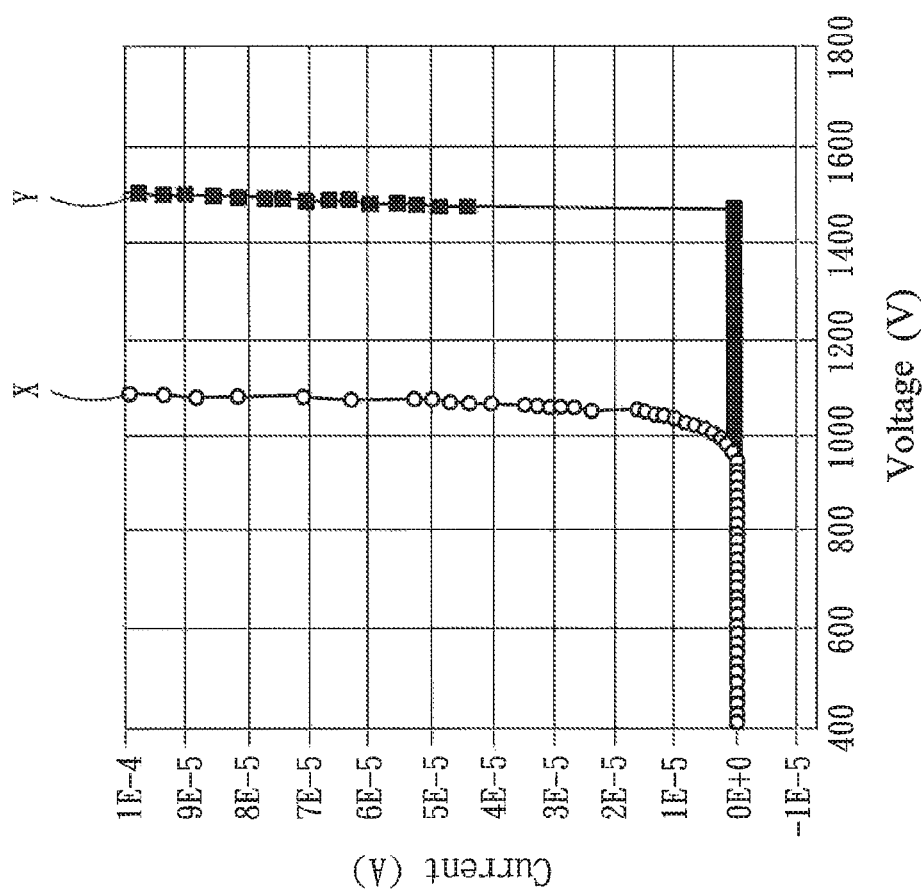
FIG. 2 is a chart showing comparison of breakdown voltages between the first embodiment of the invention and a conventional power device.

Please refer to FIG. 2 for comparison of the breakdown voltages between the first embodiment of the invention and a conventional power device. The termination structure 30 of the first embodiment of the invention has the first doped ring 31, while the termination structure 30 of the conventional power device has a protection ring like the second doped ring 32 of the invention. As shown in FIG. 2, the breakdown voltage on the electricity curve X of the conventional power device is about 1070V, while the breakdown voltage on the electricity curve Y of the first embodiment of the invention is about 1471V, i.e., about 400V greater than the conventional power device.

Figure 3:
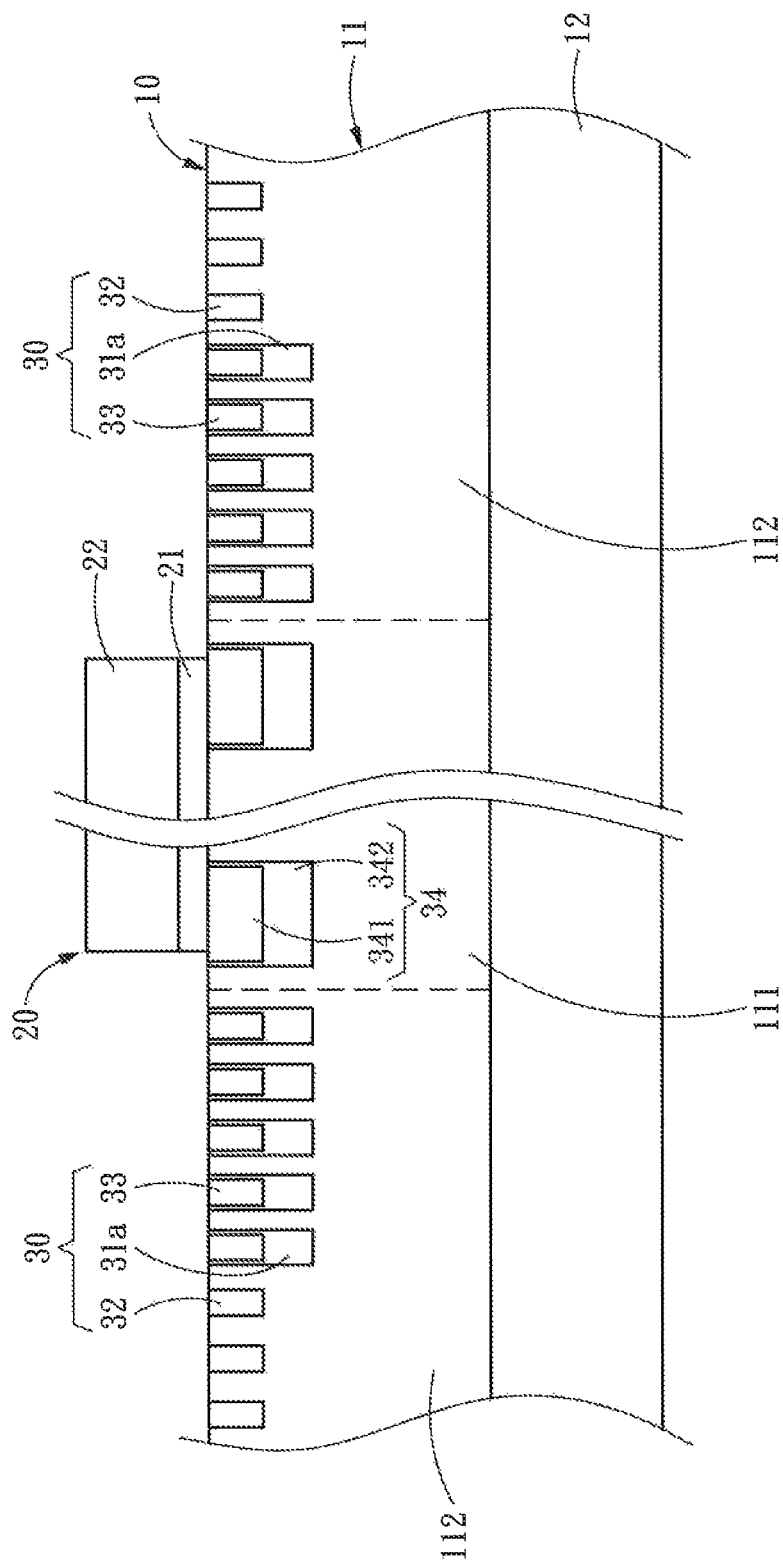
FIG. 3 is a schematic view of the structure of a second embodiment of the invention.

Please refer to FIG. 3 for a second embodiment of the invention. It differs from the first embodiment by letting the first doped ring 31*a* have a greater first doping width than that of the second doped ring 32, and the termination structure 30 further including at least one ancillary ring 33 which has a third doping concentration ranged from 1E18 to 5E19 cm$^{-3}$. The ancillary ring 33 is located to overlap the first doped ring 31*a*. Compared with the first doped ring 31*a*, the ancillary ring 33 has a smaller third doping depth, a greater third doping concentration and a smaller third doping width. Moreover, the doped well 34 includes a first doped well 341 and a second doped well 342 overlapping the first doped well 341. Compared with the second doped well 342, the first doped well 341 has a smaller doping depth and a greater doping concentration. Thus, the second embodiment, through the ancillary ring 33, can withstand a smaller voltage drop between different rings and share a more uniform electric field to enable the silicon carbide power device to get a higher breakdown voltage.

Figure 4:
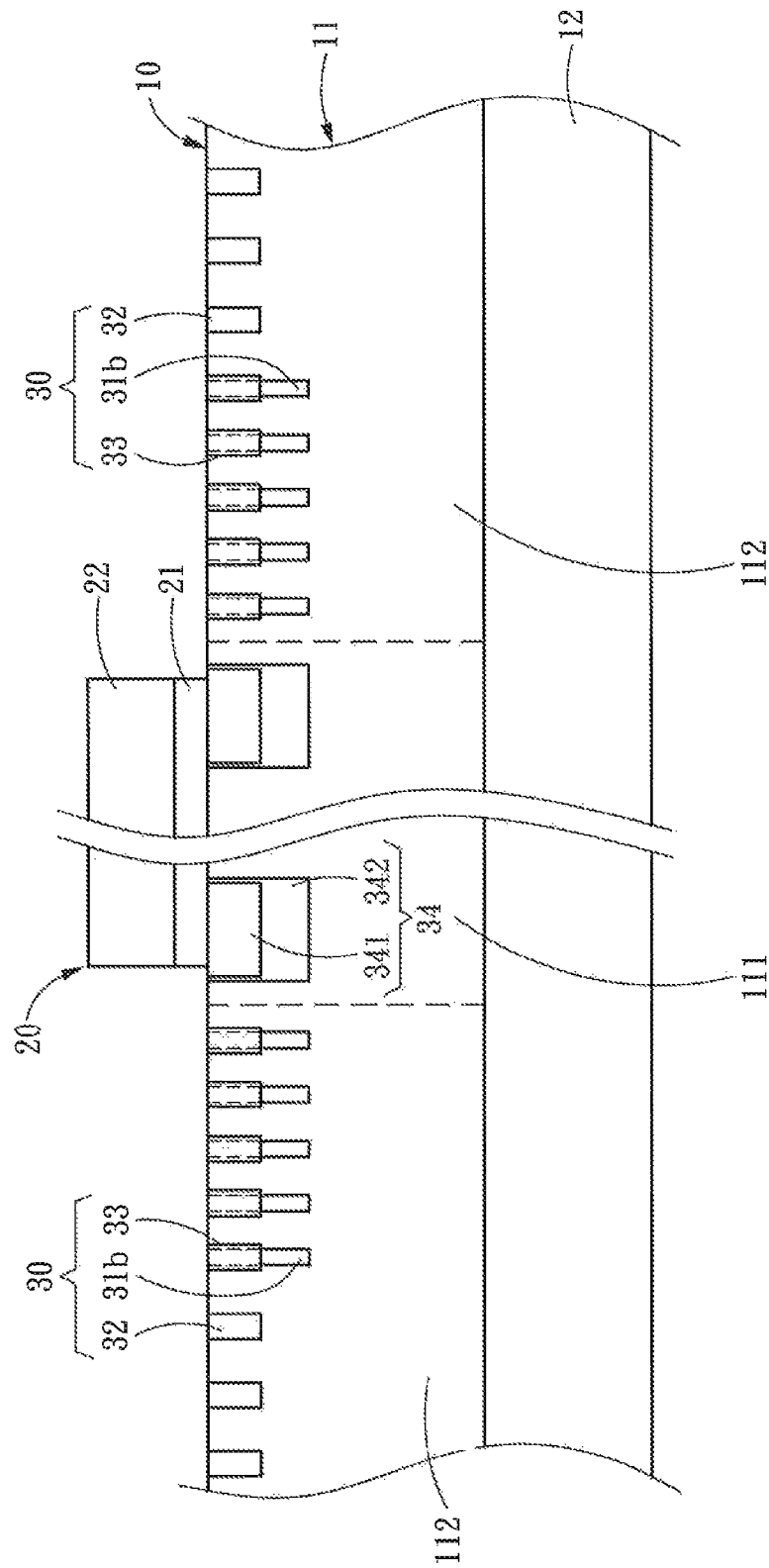
FIG. 4 is a schematic view of the structure of a third embodiment of the invention.

Please refer to FIG. 4 for a third embodiment of the invention. Compared with the second embodiment, the first doped ring 31*b* has a first doping width smaller than that of the ancillary ring 33 and also smaller than that of the second doped ring 32. Therefore, the first doped ring 31*b* can be doped deeper with greater energy without in contact with each other, thus can avoid unevenness of the breakdown voltage.

Figure 5:
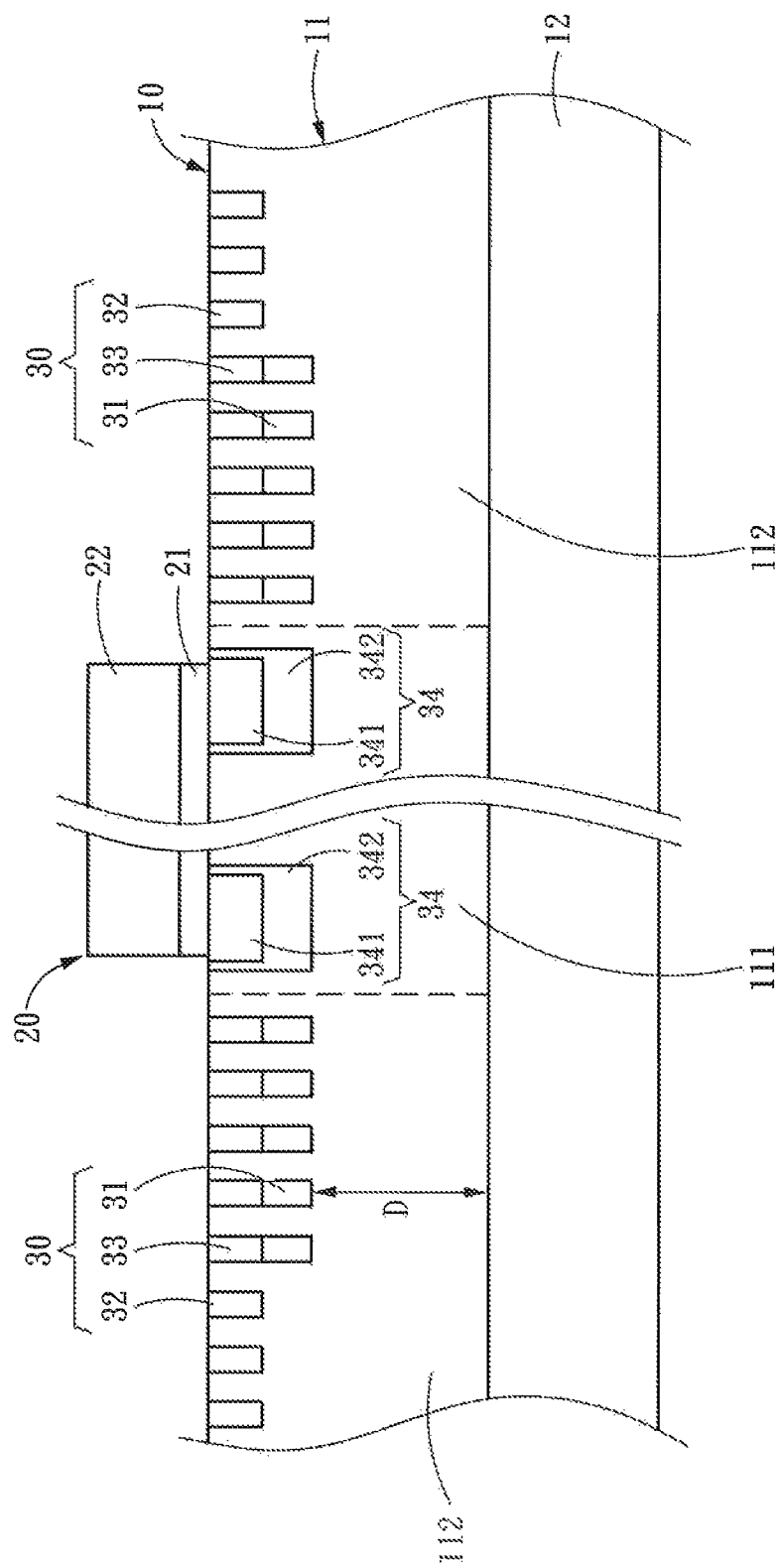
FIG. 5 is a schematic view of the structure of a fourth embodiment of the invention.

Please refer to FIG. 5 for a fourth embodiment of the invention. Compared with the first embodiment, aside from including the first doped well 341 and second doped well 342 in the doped well 34, the third doping width of the ancillary ring 33 is same as the first doping width of the first doped ring 31. Such a structure also can enhance the capability of the silicon carbide power device to withstand the breakdown voltage.

Figure 6:
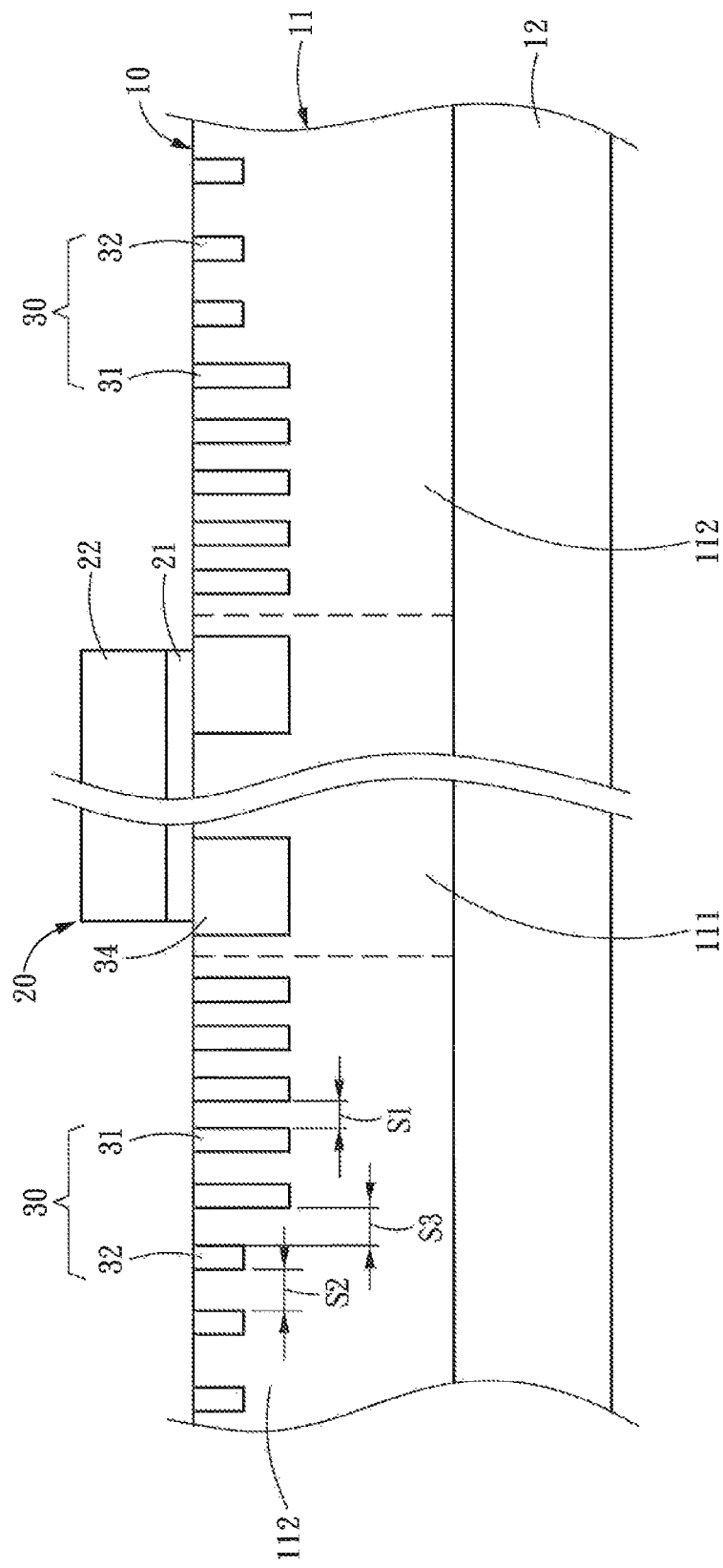
FIG. 6 is a schematic view of the structure of a fifth embodiment of the invention.

Please refer to FIG. 6 for a fifth embodiment of the invention. Compared with the first embodiment, the termination structure 30 includes multiple first doped rings 31 spaced from each other at at least one first distance S1, and multiple second doped rings 32 spaced from each other at at least one second distance S2 greater than the first distance S1, and the abutting first and second doped rings 31 and 32 are spaced from each other at a third distance S3 greater than the first distance S1 but smaller than the second distance S2. Moreover, in this embodiment, the first and second distances S1 and S2 gradually increase as their distances from the power element structure 20 also increase. For instance, the first distance S1 could be 1.5 um, 1.6 um. 1.7 um, and 1.8 um; and the third distance S3 could be 1.9 um, and the second distance S2 could be 2.0 um, 2.1 um . . . 2.5 um. Therefore, electric field can be evenly distributed in the drift layer 11, and thereby also can increase the breakdown voltage of the silicon carbide power device.

As a conclusion, the invention does not need to add an extra buffer layer. Through the first doped ring with a first doping concentration smaller than that of the second doped ring and a first doping depth greater than that of the second doped ring, the termination structure has enhanced capability to withstand the breakdown voltage to improve reliability of the silicon carbide power device, and manufacturing cost of the silicon carbide power device also can be reduced. Moreover, the invention also provides the ancillary ring with a third doping concentration, a third doping width and a third doping depth adjusted in accordance with the first doping concentration, the first doping width and the first doping depth, the breakdown voltage of the silicon carbide power device also can be enhanced. In addition, through change of the first, second and third distances, a more even electric field distribution can be achieved in the drift layer to further enhance the breakdown voltage of the silicon carbide power device. Thus it provides significant improvements over the conventional techniques.

What is claimed is:

1. A silicon carbide power device equipped with termination structure, comprising:
    a silicon carbide substrate including a drift layer which includes a first conductivity and an active zone and a termination zone surrounding the active zone;
    a power element structure located in the active zone; and
    a termination structure which is located in the termination zone and includes a second conductivity different from the first conductivity, and includes at least one first doped ring abutting and surrounding the power element structure, at least one second doped ring surrounding the first doped ring and at least one ancillary ring which overlaps the first doped ring;
    wherein the first doped ring has a first doping concentration smaller than that of the second doped ring and a first doping depth greater than that of the second doped ring, and wherein the ancillary ring has a third doping depth smaller than the first doping depth and a third doping concentration greater than the first doping concentration.

2. The silicon carbide power device of claim 1 further including at least one doped well which is located below the power element structure and includes the second conductivity.

3. The silicon carbide power device of claim 2, wherein the doped well includes a first doped well and a second doped well overlapping the first doped well, the first doped well having a doping depth smaller than that of the second doped well and a doping concentration greater than that of the second doped well.

4. The silicon carbide power device of claim 1, wherein the first doped ring has a doped width smaller than that of the second doped ring.

5. The silicon carbide power device of claim 1, wherein the ancillary ring has a greater third doping width in comparison with the first doped ring.

6. The silicon carbide power device of claim 1, wherein the first doped ring has a first doping width greater than that of the second doped ring.

7. The silicon carbide power device of claim 1, wherein the ancillary ring has a smaller third doping width in comparison with the first doped ring.

8. The silicon carbide power device of claim 1, wherein the ancillary ring has a same third doping width in comparison with the first doped ring.

9. The silicon carbide power device of claim 1, wherein the termination structure includes a plurality of first doped rings spaced from each other at at least one first distance, and a plurality of second doped rings spaced from each other at at least one second distance greater than the first distance.

10. The silicon carbide power device of claim 9, wherein the abutting first doped ring and second doped ring are spaced from each other at a third distance greater than the first distance and smaller than the second distance.

11. The silicon carbide power device of claim 9, wherein the plurality of first doped rings are spaced from each other at a plurality of first distances which gradually increase with increased distances from the power element structure.

12. The silicon carbide power device of claim 9, wherein the plurality of second doped rings are spaced from each other at a plurality of second distances which gradually increase with increased distances from the power element structure.

\* \* \* \* \*